US010331571B2

(12) United States Patent
Takada et al.

(10) Patent No.: US 10,331,571 B2
(45) Date of Patent: Jun. 25, 2019

(54) ADDRESS CONTROL CIRCUIT CAPABLE OF SETTING ADDRESS RAPIDLY AND METHOD OF SETTING ADDRESS AFTER POWER-ON RESET, THE ADDRESS CONTROL CIRCUIT PROVIDING PROTECTION AGAINST OVER-VOLTAGE

(71) Applicant: Minebea Mitsumi Inc., Nagano (JP)

(72) Inventors: Kazuo Takada, Kosai (JP); Shigeki Miyaji, Hamamatsu (JP); Yoshiaki Motoyama, Shimotsuke (JP); Yasuyuki Hasegawa, Tokyo (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 15/671,267

(22) Filed: Aug. 8, 2017

(65) Prior Publication Data
US 2018/0046584 A1 Feb. 15, 2018

(30) Foreign Application Priority Data
Aug. 12, 2016 (JP) ................ 2016-159028

(51) Int. Cl.
*G06F 13/40* (2006.01)
*G06F 12/1027* (2016.01)
(Continued)

(52) U.S. Cl.
CPC .......... *G06F 12/1027* (2013.01); *G06F 12/06* (2013.01); *G06F 13/105* (2013.01);
(Continued)

(58) Field of Classification Search
CPC .... G06F 13/105; G06F 12/1027; G06F 12/06; G11C 8/04
See application file for complete search history.

(56) References Cited
U.S. PATENT DOCUMENTS 4,046,999 A * 9/1977 Katsuoka ................ G06G 7/24
327/350
5,414,862 A * 5/1995 Suzuki ............... G05B 19/0426
713/300
(Continued)

FOREIGN PATENT DOCUMENTS
JP 05-37535 A 3/2013

OTHER PUBLICATIONS
Suzuki, Translation of JPH0537535 (A), Feb. 12, 1993.*
Maxim Application note 3227 ("Power-On Reset and Related Supervisory Functions", Jul. 2004).*

*Primary Examiner* — Mushfique Siddique
(74) *Attorney, Agent, or Firm* — Pearne & Gordon LLP

(57) ABSTRACT
An address control circuit includes a setting terminal connectable to a ground potential, a time constant setting circuit connected to the setting terminal, and a control unit connected to the time constant setting circuit and configured to set an address for serial communication. The time constant setting circuit includes a resistive element disposed between the setting terminal and the control unit and configured to protect the control unit against overvoltage. The control unit outputs a voltage to the time constant setting circuit, and sets an address at a predetermined timing based on the voltage input from the time constant setting circuit when a predetermined time has passed after the output of the voltage is stopped.

5 Claims, 4 Drawing Sheets

(51) Int. Cl.
  *G06F 12/06* (2006.01)
  *G06F 13/10* (2006.01)
  *G11C 8/04* (2006.01)
  *G11C 8/06* (2006.01)
  *G11C 7/20* (2006.01)
  *G11C 8/18* (2006.01)
(52) U.S. Cl.
  CPC .................. *G11C 8/04* (2013.01); *G11C 8/06* (2013.01); *G11C 7/20* (2013.01); *G11C 8/18* (2013.01)

(56) References Cited

U.S. PATENT DOCUMENTS

| | | | | |
|---|---|---|---|---|
| 5,517,144 | A * | 5/1996 | Nakashima | ...... H03K 3/356008 327/198 |
| 5,929,672 | A * | 7/1999 | Mitani | ................. H03K 17/223 327/143 |
| 2003/0142572 | A1* | 7/2003 | Ishida | .................... G11C 5/143 365/226 |
| 2009/0109168 | A1* | 4/2009 | Lee | ...................... G09G 3/3426 345/102 |
| 2012/0020401 | A1* | 1/2012 | Itou | .................. H04L 12/40019 375/224 |
| 2012/0025886 | A1* | 2/2012 | Cho | ....................... H03K 17/22 327/212 |
| 2013/0057339 | A1* | 3/2013 | Koudar | ............... G06F 13/4252 327/565 |
| 2016/0259747 | A1* | 9/2016 | Vandersteegen | ........ G06F 1/266 |
| 2016/0349328 | A1* | 12/2016 | Seino | ................... B60R 16/023 |

* cited by examiner

ADDRESS CONTROL CIRCUIT CAPABLE OF SETTING ADDRESS RAPIDLY AND METHOD OF SETTING ADDRESS AFTER POWER-ON RESET, THE ADDRESS CONTROL CIRCUIT PROVIDING PROTECTION AGAINST OVER-VOLTAGE

CROSS REFERENCE TO RELATED APPLICATIONS

This application claims the benefit of Japanese Patent Application No. 2016-159028, filed on Aug. 12, 2016, which is hereby incorporated by reference in its entirety.

BACKGROUND

Technical Field

The present disclosure relates to an address control circuit and a control method for an address control circuit, and more particularly, to an address control circuit and a control method for an address control circuit which are used for devices used by being connected to a network.

BACKGROUND

For example, in devices, such as an actuator and a sensor, which are used by being connected to a serial communication network, such as an on-vehicle system, an address control circuit for setting an address of a node for connecting the devices to the network is used.

Japanese Patent Application Laid-Open No. 5-37535 discloses a configuration of an address control circuit for setting an address based on address designation information input after power-on resetting.

In the address control circuit disclosed in Japanese Patent Application Laid-Open No. 5-37535, when an unexpectedly high voltage (overvoltage) is input from a setting terminal provided for address setting, a breakdown or failure may occur in the address control circuit.

The present disclosure is related to providing an address control circuit and a control method for an address control circuit which are capable of protecting a circuit against overvoltage input from a setting terminal for setting an address and capable of setting the address rapidly.

SUMMARY

According to an aspect of the present disclosure, an address control circuit includes: a setting terminal connectable to a ground potential; a time constant setting circuit connected to the setting terminal; and a control unit connected to the time constant setting circuit and configured to set an address for serial communication. The time constant setting circuit includes a resistive element disposed between the setting terminal and the control unit and configured to protect the control unit against overvoltage. The control unit outputs a voltage to the time constant setting circuit, and sets the address at a predetermined timing based on the voltage input from the time constant setting circuit when a predetermined time has passed after the output of the voltage is stopped.

Preferably, the control unit includes: a first storage unit to store address setting information; a determination unit to make a determination as to a magnitude of a voltage input from the time constant setting circuit; a setting unit to set the address based on the address setting information stored in the first storage unit and a determination result of the determination unit; and a second storage unit to store the set address, and the control unit performs control in such a manner that communication is performed based on the address stored in the second storage unit.

Preferably, the time constant setting circuit further includes a capacitive element disposed in a path connecting the ground potential and a connection point between the resistive element and the setting terminal, and when the setting terminal is in an open state and a voltage is output from the control unit, electric charge is stored in the capacitive element.

Preferably, a resistance value of the resistive element and a capacitance value of the capacitive element are set in such a manner that the control unit is protected by the resistive element when the overvoltage is input to the setting terminal, and the control unit is configured to set the address at the predetermined timing until a predetermined address setting period has passed from start-up of the address control circuit.

According to another aspect of the present disclosure, a control method for an address control circuit, the address control circuit including: a setting terminal connectable to a ground potential; a time constant setting circuit connected to the setting terminal; and a control unit connected to the time constant setting circuit and setting an address for serial communication, and the time constant setting circuit including a resistive element disposed between the setting terminal and the control unit, the control method for the address control circuit includes: a first step of outputting a voltage to the time constant setting circuit from the control unit; a second step of stopping the output of the voltage after the first step is performed; and a third step of setting the address at a predetermined timing based on the voltage input from the time constant setting circuit after a lapse of a predetermined time after the second step is performed.

According to these aspects of this disclosure, it is possible to provide an address control circuit and a control method for an address control circuit which are capable of protecting a circuit against overvoltage input from a setting terminal for setting an address and capable of setting the address rapidly.

DETAILED DESCRIPTION

An address control circuit according to an embodiment of the present disclosure will be described below.

The address control circuit is used for, for example, an actuator which uses a stepping motor or the like, and the address control circuit sets an address for the actuator when the actuator is used by being connected to a serial communication network. By performing the address setting, the actuator can communicate with another device connected to the network.

Embodiments

Figure 1:
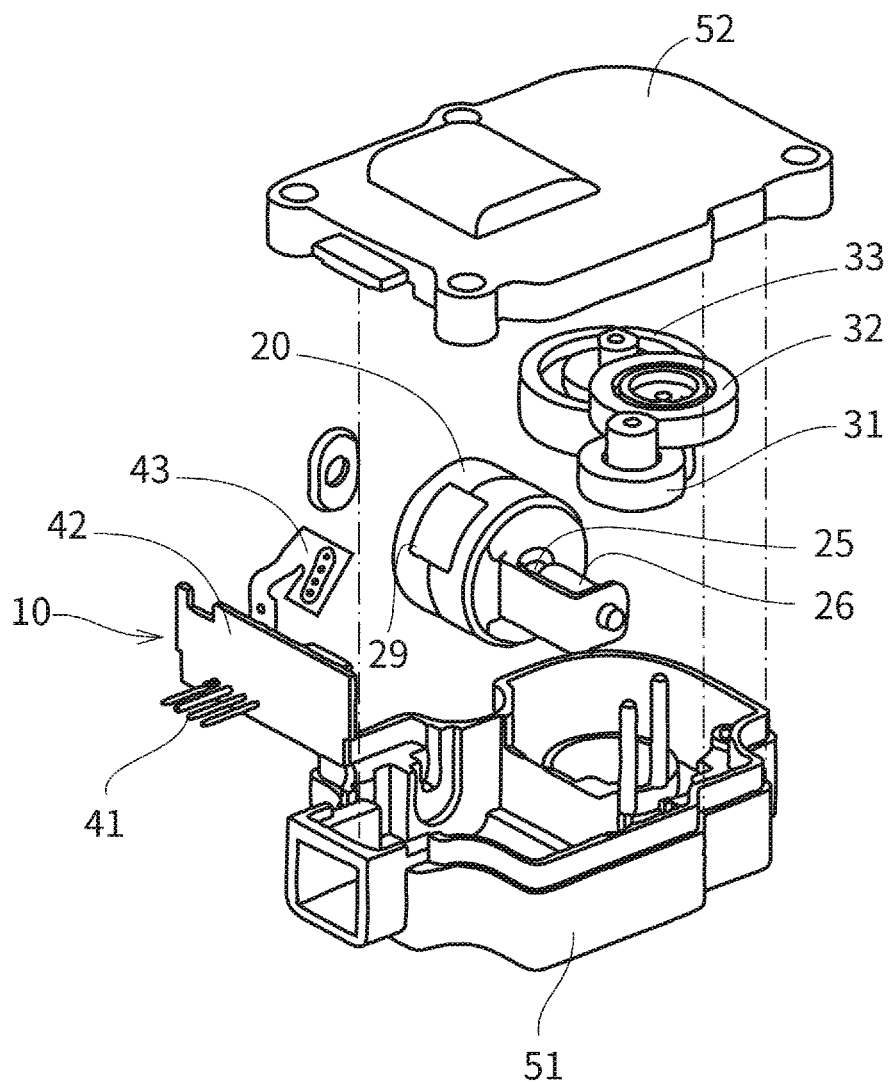
FIG. 1 is an exploded perspective view illustrating an example of an actuator using an address control circuit according to an embodiment of the present disclosure.

FIG. 1 is an exploded perspective view illustrating an example of an actuator using an address control circuit according to this embodiment.

As illustrated in FIG. 1, an actuator 1 is covered with a case 51 and a cover 52. A motor control device 10, a stepping motor 20, a secondary gear 31, a tertiary gear 32, an output gear 33, and the like are housed in the actuator 1. An external output gear provided on the output gear 33 is exposed at a bottom surface of the case 51. The external output gear transmits a drive force of the actuator 1 to the outside.

The stepping motor 20 generates the drive force of the actuator 1. A primary gear 26 is attached to an output shaft 25 of the stepping motor 20. The primary gear 26 of the stepping motor 20 meshes with the secondary gear 31. The secondary gear 31 meshes with the tertiary gear 32. The tertiary gear 32 meshes with the output gear 33.

The motor control device 10 includes a printed circuit board 42 and a flexible printed circuit board 43 which connects the printed circuit board 42 with a motor terminal 29 of the stepping motor 20. The printed circuit board 42 is provided with a drive circuit for driving the stepping motor 20, a motor control circuit for controlling the drive circuit, an address control circuit 101 (illustrated in FIG. 2) for setting an address of the actuator 1, and the like. The printed circuit board 42 is provided with an external connection terminal 41 that is exposed to the outside of the case 51 and the cover 52. The motor control device 10 operates, for example, when a power supply voltage Vbb is input to the motor control device 10 from the outside via the external connection terminal 41, or when an instruction signal is received from an external device.

The motor control device 10 supplies a drive power to the stepping motor 20 based on the received input voltage, and drives the stepping motor 20. When the stepping motor 20 is driven, the primary gear 26 is rotated together with the output shaft 25. The drive force of the rotation is sequentially transmitted to the secondary gear 31, the tertiary gear 32, the output gear 33, and the external output gear, and is output to the outside by the external output gear.

Note that circuits housed in the case 51 and the cover 52 may include, for example, only the drive circuit. In this case, the motor control device 10 may be composed of the drive circuit, which is housed in the case 51 and the cover 52, and the external motor control circuit connected to the drive circuit, and the address control circuit 101.

Figure 2:
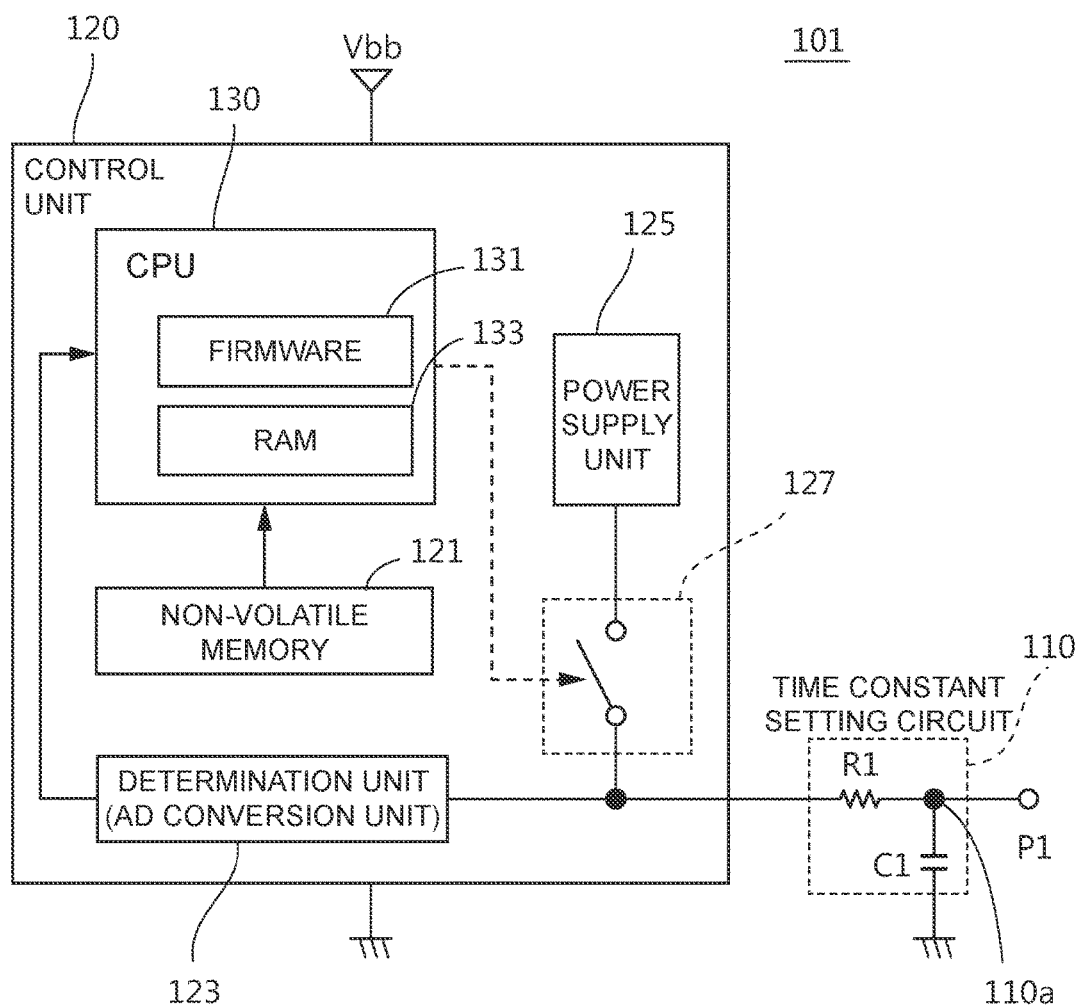
FIG. 2 is a block diagram illustrating an example of the address control circuit.

FIG. 2 is a block diagram illustrating an example of the address control circuit 101.

As illustrated in FIG. 2, the address control circuit 101 includes a control unit 120 and a time constant setting circuit 110. The address control circuit 101 operates when the power supply voltage Vbb is supplied to the control unit 120. The power supply voltage Vbb is, for example, a DC voltage of about 18 V. However, the power supply voltage Vbb is not limited to this voltage.

The address control circuit 101 is provided with a setting terminal P1 for setting an address. The setting terminal P1 is connectable to a ground potential. The setting terminal P1 is a terminal having an address switching function.

In this embodiment, the control unit 120 is packaged as an IC (integrated circuit). The control unit 120 sets the address for serial communication. The control unit 120 is configured to set the address depending on the state of the setting terminal P1 as described later.

The time constant setting circuit 110 is disposed between the setting terminal P1 and the control unit 120. The time constant setting circuit 110 is an integrating circuit including a resistive element R1 and a capacitive element C1.

The resistive element R1 is disposed between the setting terminal P1 and the control unit 120. Assuming a case where a current flows from the setting terminal P1 to the control unit 120, the current passes through the resistive element R1. The resistive element R1 is not limited to a resistor, but instead may be an element having a resistance component. The resistance value of the resistive element R1 is set in such a manner that the control unit 120 is protected by the resistive element R1 when overvoltage is input from the setting terminal P1.

The capacitive element C1 is, for example, a capacitor. However, the capacitive element C1 is not limited to the capacitor. The capacitive element C1 is disposed in a path that connects the ground potential and a connection point 110a (a terminal on the setting terminal P1 side among the terminals of the resistive element R1) between the resistive element R1 and the setting terminal P1.

In a case where the setting terminal P1 is in an open state as described later, the time constant setting circuit 110 stores electric charge in the capacitive element C1 and discharges the stored electric charge with a time constant which is determined by the resistance value of the resistive element R1 and the capacitance value of the capacitive element C1 when a voltage is output from the control unit 120.

The control unit 120 includes a CPU (an example of a setting unit) 130, a non-volatile memory (an example of a first storage unit) 121, a determination unit 123, a power supply unit 125, and a switch circuit 127.

The non-volatile memory 121 stores address setting information. The address setting information is, for example, information adopted as an initial address when the CPU 130 sets an address. In this embodiment, as the address setting information, information corresponding to one address, such as any one of "1", "2", or "3", is stored.

The determination unit 123 is connected to the time constant setting circuit 110. The determination unit 123 makes a determination as to the magnitude of a voltage input from the time constant setting circuit 110, and outputs the result to the CPU 130. The determination is performed in two steps of, for example, high (H) and low (L). In this embodiment, the determination unit 123 compares the voltage input from the time constant setting circuit 110 with a predetermined threshold. When the voltage is higher than the threshold, the voltage is determined to high, and when the voltage is lower than the threshold, the voltage is determined to low. The determination result is input to the CPU 130 as a digital signal.

The determination unit 123 is, for example, an AD conversion unit. The determination unit 123 may be a comparator.

The power supply unit 125 outputs a predetermined voltage DC power by using, for example, the power supply voltage Vbb which is supplied to the address control circuit 101. The power supply unit 125 is connected to a line that connects the resistive element R1 of the time constant setting circuit 110 with the determination unit 123 via the switch circuit 127. When the switch circuit 127 is turned on, DC power supplied from the power supply unit 125 is output to the line. Specifically, when the setting terminal P1 is in an open state as described later and the switch circuit 127 is turned on, voltage is applied to the time constant setting circuit 110 from the power supply unit 125 and electric charge is stored in the capacitive element C1.

The CPU 130 performs various processes based on a stored firmware 131. The CPU 130 includes a RAM (an example of a second storage unit) 133 which is used as a working memory when the CPU 130 performs processing. At start-up of the address control circuit 101, the CPU 130 sets an address as described below and writes the set address into the RAM 133. After that, the CPU 130 performs control in such a manner that serial communication is performed between the actuator 1 and another device based on the address stored in the RAM 133.

Description of Address Switching Function

In this embodiment, the setting terminal P1 is used in one of a grounded state in which the setting terminal P1 is connected to the ground potential (GND) and an open state in which the setting terminal P1 is not connected to any potential. The address control circuit 101 sets, as the address of the actuator 1, one of two addresses, depending on whether the setting terminal P1 is in the grounded state or the open state. In other words, a user selects to make the setting terminal P1 in the grounded state or in the open state, thereby making it possible to select the address of the actuator 1. The address control circuit 101 is configured to recognize the state of the setting terminal P1, the grounded state or the open state, as address switching information, and switch the address to be written into the RAM 133 by the CPU 130.

Specifically, the control unit 120 outputs a voltage from the power supply unit 125 to the time constant setting circuit 110, and sets an address at a predetermined timing based on the voltage input from the time constant setting circuit 110 when a predetermined time elapses after the output of the voltage is stopped.

The voltage input from the time constant setting circuit 110 when the predetermined time has passed after the output of the voltage is stopped is substantially zero when the setting terminal P1 is in the grounded state, and is relatively high when the setting terminal P1 is in the open state. The CPU 130 sets an address based on the result of the determination by the determination unit 123 on the voltage at this time.

Figure 3:
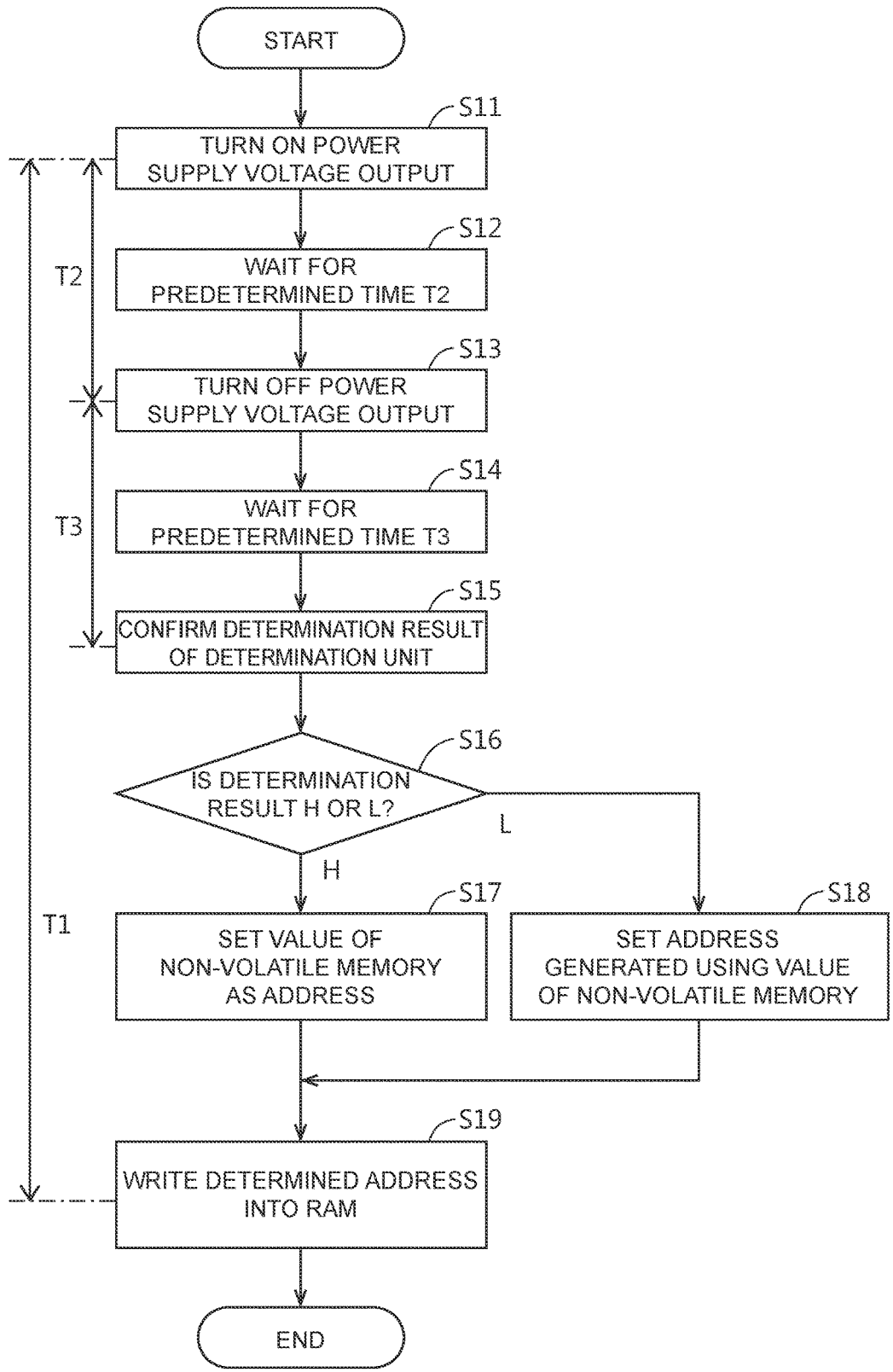
FIG. 3 is a flowchart showing an operation at start-up of the address control circuit.

FIG. 3 is a flowchart showing an operation at start-up of the address control circuit 101.

At start-up of the address control circuit 101, that is, after power-on reset of the address control circuit 101, address setting is performed in the following manner based on the control operation by the CPU 130.

As illustrated in FIG. 3, when start-up of the address control circuit 101 is initiated after power-on reset of the address control circuit 101, in step S11, the CPU 130 turns on the switch circuit 127 (first step). As a result, the voltage supplied from the power supply unit 125 is output to the time constant setting circuit 110. When the setting terminal P1 is in the open state, charging of the capacitive element C1 is started. On the other hand, when the setting terminal P1 is in the grounded state, charging of the capacitive element C1 is not performed.

In step S12, the CPU 130 waits for a predetermined time T2. The predetermined time T2 is set according to, for example, the resistance value of the resistive element R1 and the capacitance value of the capacitive element C1 of the time constant setting circuit 110. For example, the predetermined time T2 is set in such a manner that the voltage of the capacitive element C1 reaches a predetermined value after a lapse of the predetermined time T2 from step S11 when the setting terminal P1 is in the open state. The predetermined T2 may be set in such a manner that the capacitive element C1 is fully charged.

After a lapse of the predetermined time T2 from step S11, in step S13, the CPU 130 turns off the switch circuit 127 (second step). As a result, the output of the voltage from the power supply unit 125 is turned off. When the capacitive element C1 is charged, discharge of the capacitive element C1 is started after the output of the voltage from the power supply unit 125 is turned off, and the voltage is input to the determination unit 123 of the control unit 120 from the time constant setting circuit 110.

In step S14, the CPU 130 waits for a predetermined time T3. The predetermined time T3 is set depending on, for example, the resistance value of the resistive element R1 and the capacitance value of the capacitive element C1 of the time constant setting circuit 110. The predetermined time T3 is set in such a manner that, for example, the determination result of the determination unit 123 when the predetermined time T3 has passed from step S13 shows high when the setting terminal P1 is in the open state, and shows low when the setting terminal P1 is in the grounded state. When the setting terminal P1 is in the open state and the predetermined time T3 has passed, the voltage of the capacitive element C1 needs to be equal to or higher than a predetermined value.

After the predetermined time T3 has passed from step S13, in step S15, the CPU 130 confirms the determination result input from the determination unit 123 (start of a third step).

In step S16, the CPU 130 determines whether the determination result shows high (H) or (L).

When the determination result shows high (H) in step S16, in step S17, the CPU 130 determines that the address setting information stored in the non-volatile memory 121 is used as the address. For example, when the address setting information indicates "2", "2" is used as the address. Further, for example, when the address setting information indicates "3", "3" is used as the address.

On the other hand, when the determination result in step S16 shows low (L), in step S18, the CPU 130 determines that the address generated in accordance with a predetermined generation method using the address setting information stored in the non-volatile memory 121 is used as the address. In this embodiment, for example, it is determined that a value obtained by adding N (for example, N=10) to the address setting information is used as the address. For example, when the address setting information indicates "2", "2+N", i.e., "12" is used as the address. Further, for example, when the address setting information indicates "3", "3+N", i.e., "13" is used as the address. The address generation method is not limited to this method. A value obtained by adding a predetermined value (for example, "1") to the address setting information, or a value obtained by subtracting the predetermined value from the address setting information, may be used as the address, or a value obtained by multiplying the address setting information by the predetermined value may be used as the address.

In step S19, the CPU 130 writes the address, which is determined to be used, into the RAM 133 (end of the third step). Thus, during a period from start-up of the address control circuit 101 to the lapse of a predetermined address setting period, address setting is completed at a predetermined timing based on the voltage input from the time constant setting circuit 110, and serial communication is performed using the set address.

Note that in this embodiment, the resistance value of the resistive element R1 and the capacitance value of the capacitive element C1 are set as follows.

That is, also when overvoltage, such as the power supply voltage Vbb, is input to the setting terminal P1, the resistance value of the resistive element R1 is set in such a manner that the control unit 120 is protected by the resistive element R1 of the time constant setting circuit 110. Specifically, the resistance value of the resistive element R1 is set to a value equal to or greater than a value corresponding to the magnitude of the voltage against which the control unit 120 is protected. For example, even if 18 V is applied as overvoltage, when the resistance value of the resistive element R1 is 100 kΩ, a current is 180 µA. The resistance value of the resistive element R1 is set to an appropriate value, thereby making it possible to protect the control unit 120.

Further, the resistance value of the resistive element R1 and the capacitance value of the capacitive element C1 are set in such a manner that a standby period T1 (illustrated in FIG. 3) required for the control unit 120 to set an address from start-up of the address control circuit 101 is minimized. Specifically, the resistance value and the capacitance value are set in such a manner that the CPU 130 can reliably turn on/off the switch circuit 127 and confirm the determination result of the determination unit 123, and the predetermined time T2 and the predetermined time T3 can be set in such a manner that a time obtained by adding the predetermined time T2 and the predetermined time T3 can be minimized. In this embodiment, the resistance value and the capacitance value are set in such a manner that the standby period T1 is shorter than a predetermined period according to the specifications or the like of the actuator 1.

In particular, the capacitance value of the capacitive element C1 is determined in such a manner that a time for charging the capacitive element C1 and a time for discharging the capacitive element C1 are each set to an appropriate time. When the capacitance value of the capacitive element C1 is relatively large, there is an advantage that the long predetermined time T3 can be secured and the determination based on the determination result of the determination unit 123 can be reliably made. On the other hand, there is a disadvantage that the predetermined time T2 becomes longer. When the capacitance value of the capacitive element C1 is relatively small, there is an advantage that the predetermined time T2 can be shortened. On the other hand, there is a disadvantage that discharge of the capacitive element C1 becomes faster and then the predetermined time T3 needs to be shortened. When the discharge speed of the capacitive element C1 is measured and the capacitive element C1 having an optimum capacitance value is used, the determination on the voltage input from the time constant setting circuit 110 can be performed at an ideal timing.

Advantageous Effects of Embodiments

In the address control circuit 101 having the configuration described above, the time constant setting circuit 110 has an overvoltage protection function and a function for optimizing the voltage detection timing of the time constant setting circuit 110.

Appropriately setting the resistance value of the resistive element R1 of the time constant setting circuit 110 enables overvoltage protection for the control unit 120. Accordingly, even if the setting terminal P1 is erroneously connected to the power supply voltage Vbb and the potential of the setting terminal P1 comes into an overvoltage state, the resistive element R1 of the time constant setting circuit 110 prevents an adverse effect on the IC or the like which forms the control unit 120.

Further, in the time constant setting circuit 110, the capacitance value of the capacitive element C1 is appropriately set so that an address can be set accurately and relatively rapidly after start-up of the address control circuit 101, while the above-mentioned overvoltage protection effect can be obtained.

As a result, the control unit 120 switches, at a predetermined timing, between the state in which the setting terminal P1 is in the grounded state and the state in which the setting terminal P1 is in the open state (address setting), based on the voltage input from the time constant setting circuit 110, so that one of two types of addresses can be easily used.

The address control circuit 101 includes the time constant setting circuit 110 and the control unit 120 having the functions as described above, which makes it possible to perform overvoltage protection and perform address setting rapidly and accurately.

Description of Modified Examples

Note that the RAM may be disposed outside of the CPU.

Figure 4:
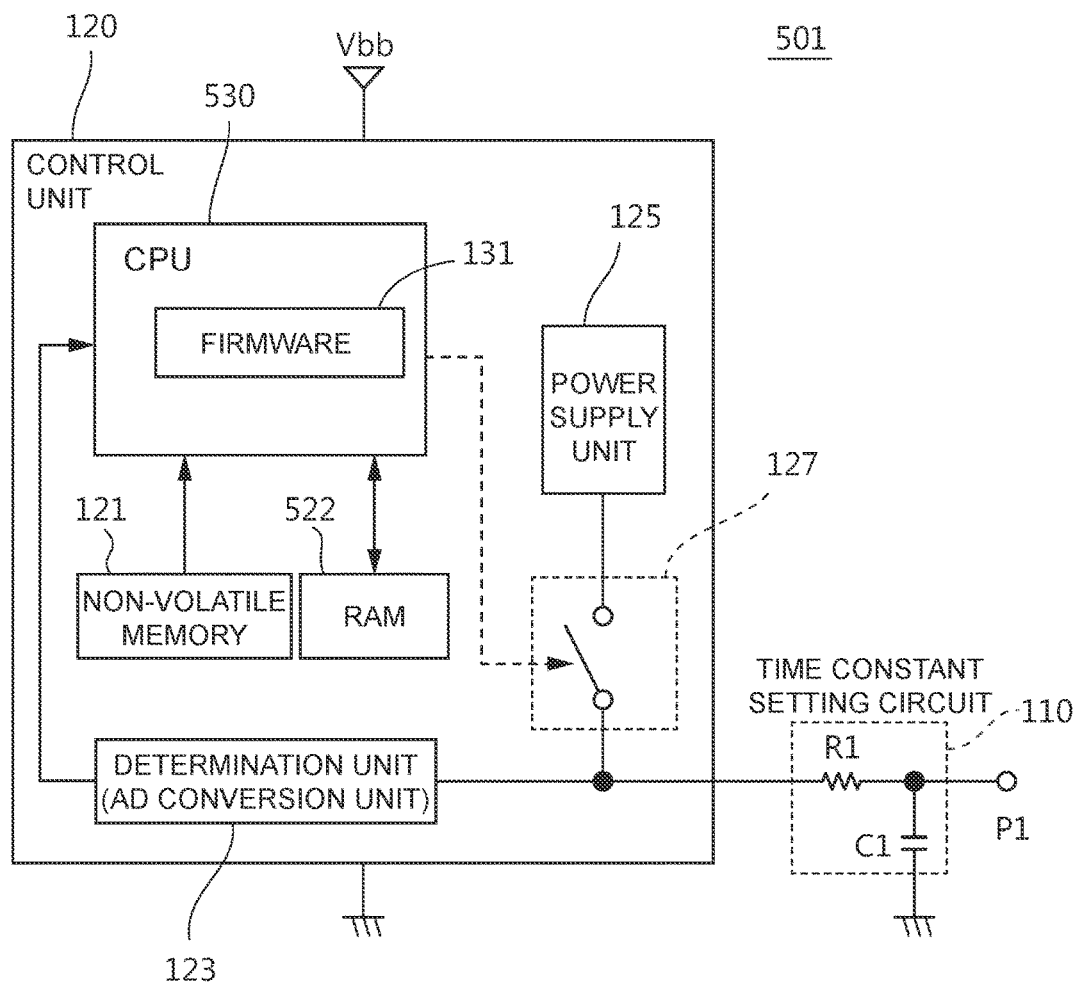
FIG. 4 is a block diagram illustrating a configuration of an address control circuit according to a modified example of an embodiment of the present disclosure.

FIG. 4 is a block diagram illustrating an example of an address control circuit 501 according to a modified example of this embodiment.

As illustrated in FIG. 4, in the address control circuit 501, a RAM 522 is provided outside of a CPU 530 of the control unit 120. Also with this configuration, address setting can be performed in a similar manner to that described above.

Other

The type and number of pieces of address setting information stored in a non-volatile memory are not limited. Any method for setting an address depending on the state of the setting terminal can be employed arbitrarily. For example, the non-volatile memory stores the address setting information corresponding to two types of addresses, i.e., high and low, and an address may be set using the address setting information corresponding to each of high and low. In this case, there is no need to perform address generation processing in accordance with the predetermined generation method.

A range of a voltage to be applied to the setting terminal to be protected can be changed as appropriate. When a large voltage is applied, the resistance value of the resistive element of the time constant setting circuit may be increased to reliably protect the IC or the like of the control unit.

The configuration of the actuator described above is merely an example, and the actuator may have a configuration different from the above configuration.

Only a part of the control unit may be configured as an integrated circuit. Further, the control unit and the time constant setting circuit may be included in the integrated circuit.

The hardware configuration of the actuator, such as the stepping motor or the motor control device, is not limited to the above configuration.

The processing in the embodiments described above may be performed by software or a hardware circuit.

It is also possible to provide a program for executing processing in the embodiments described above. The program may be stored in a storage medium, such as a CD-ROM, a flexible disc, a hard disk, a ROM, a RAM, a memory card, and may be provided to a user. The program may be downloaded to a device through a communication line such as the Internet. The processing explained in the flowcharts described above is executed by a CPU or the like in accordance with the program.

The embodiments described above are considered to be illustrative in all respects and are not limitative. It is intended that the scope of the present disclosure is defined not by the above description, but by the claims, and includes all modifications within the equivalent meaning and scope of the claims.

What is claimed is:

1. An address control circuit comprising:
    a setting terminal connectable to a ground potential;
    a time constant setting circuit connected to the setting terminal; and
    a control unit connected to the time constant setting circuit and configured to set an address for serial communication, wherein
    the time constant setting circuit includes a resistive element disposed between the setting terminal and the control unit and configured to protect the control unit against overvoltage, and
    the control unit outputs a voltage to the time constant setting circuit when start-up of the address control circuit is initiated, and sets the address at a predetermined timing based on voltage input from the time constant setting circuit when a predetermined time has passed after the output of the voltage is stopped,
    wherein the control unit includes:
        a first storage unit to store address setting information;
        a determination unit to make a determination as to a magnitude of voltage input from the time constant setting circuit;
        a setting unit to set the address based on the address setting information stored in the first storage unit and a determination result of the determination unit; and
        a second storage unit to store the set address, and
    the control unit performs control in such a manner that communication is performed based on the address stored in the second storage unit.

2. An address control circuit comprising:
    a setting terminal connectable to a ground potential;
    a time constant setting circuit connected to the setting terminal; and
    a control unit connected to the time constant setting circuit and configured to set an address for serial communication, wherein
    the time constant setting circuit includes a resistive element disposed between the setting terminal and the control unit and configured to protect the control unit against overvoltage, and
    the control unit outputs a voltage to the time constant setting circuit when start-up of the address control circuit is initiated, and sets the address at a predetermined timing based on voltage input from the time constant setting circuit when a predetermined time has passed after the output of the voltage is stopped,
    wherein the time constant setting circuit further includes a capacitive element disposed in a path connecting the ground potential and a connection point between the resistive element and the setting terminal, and when the setting terminal is in an open state and voltage is output from the control unit, electric charge is stored in the capacitive element.

3. The address control circuit according to claim 2, wherein a resistance value of the resistive element and a capacitance value of the capacitive element are set in such a manner that the control unit is protected by the resistive element when the overvoltage is input to the setting terminal, and the control unit is configured to set the address at the predetermined timing until a predetermined address setting period has passed from start-up of the address control circuit.

4. An address control circuit comprising:
    a setting terminal connectable to a ground potential;
    a time constant setting circuit connected to the setting terminal; and
    a control unit connected to the time constant setting circuit and configured to set an address for serial communication, wherein
    the time constant setting circuit includes a resistive element disposed between the setting terminal and the control unit and configured to protect the control unit against overvoltage, and the control unit outputs a voltage to the time constant setting circuit when start-up of the address control circuit is initiated, and sets the address at a predetermined timing based on voltage input from the time constant setting circuit when a predetermined time has passed after the output of the voltage is stopped,
    wherein the control unit is configured to set the address corresponding to magnitude of the voltage input from the time constant setting circuit.

5. A control method for an address control circuit, the address control circuit including:
    a setting terminal connectable to a ground potential;
    a time constant setting circuit connected to the setting terminal; and
    a control unit connected to the time constant setting circuit and setting an address for serial communication, wherein
    the time constant setting circuit includes a resistive element disposed between the setting terminal and the control unit,
    the control method for the address control circuit comprising:
    a first step of outputting a voltage to the time constant setting circuit from the control unit when start-up of the address control circuit is initiated;
    a second step of stopping the output of the voltage after the first step is performed; and
    a third step of setting the address at a predetermined timing based on voltage input from the time constant setting circuit after a lapse of a predetermined time after the second step is performed,
    wherein the third step further comprises the control unit setting the address corresponding to magnitude of the voltage input from the time constant setting circuit.

* * * * *